United States Patent [19]

Kohm

[11] Patent Number: 4,804,575
[45] Date of Patent: Feb. 14, 1989

[54] MULTILAYER PRINTED WIRING BOARDS

[75] Inventor: Thomas S. Kohm, Huntington, N.Y.

[73] Assignee: Kollmorgen Corporation, Simsbury, Conn.

[21] Appl. No.: 280

[22] Filed: Jan. 14, 1987

[51] Int. Cl.⁴ .......................... B32B 3/00; B32B 15/08; H05K 1/00; C08F 8/00

[52] U.S. Cl. ..................... 428/209; 428/460; 428/901; 174/68.5; 525/109; 525/121

[58] Field of Search ......................... 428/209, 460, 901; 174/68.5; 525/109, 121

[56] References Cited

U.S. PATENT DOCUMENTS

| | | | |
|---|---|---|---|
| 3,146,125 | 8/1964 | Schneble, Jr. et al. | 428/209 |
| 3,625,758 | 12/1971 | Stahl et al. | 174/68.5 |
| 3,737,339 | 6/1973 | Alsberg et al. | 428/418 |
| 3,925,138 | 12/1975 | Shaul et al. | 156/313 |
| 3,932,689 | 1/1976 | Watanabe et al. | 428/418 |
| 3,956,041 | 5/1976 | Polichette et al. | 156/3 |
| 4,152,477 | 5/1979 | Haruta et al. | 428/209 |
| 4,239,813 | 12/1980 | Murakami et al. | 427/98 |
| 4,251,649 | 2/1981 | Hara et al. | 525/439 |
| 4,254,186 | 3/1981 | Acitelli et al. | 428/462 |
| 4,396,679 | 8/1983 | Gaku et al. | 428/412 |
| 4,457,952 | 7/1984 | Kawamoto et al. | 427/98 |
| 4,578,315 | 3/1986 | Santorelli | 428/414 |
| 4,647,631 | 3/1987 | Noguchi et al. | 525/510 |

OTHER PUBLICATIONS

Eby L. T. and Brown H. P. in "Treatise on Adhesion and Adhesives", vol. 2, Patrick R. L. Ed. Copyright 1969, Marcel Dekker, NY, pp. 129–141.

Rider D. K., "Adhesives in Printed Circuit Applications" in Symposium on Adhesives for Structural Applications, Interscience, NY, Copyright 1961, pp. 49–59.

Primary Examiner—Ellis P. Robinson
Assistant Examiner—P. J. Ryan
Attorney, Agent, or Firm—Morgan & Finnegan

[57] ABSTRACT

A multilayer printed wiring board is described having (1) an inner layer conductive pattern on an organic insulating base material, (2) a poly(vinyl acetal)-phenolic resin coating containing an amine substituted organic zirconate or titanate coupling agent, (3) a dielectric insulating layer, (4) a bonding composition capable of being adhesion promoted for electroless metal deposition comprising a phenolic resin having at least two methylol groups and substantially free of methyl ether groups, a heat resistant aromatic or cyclic resin having functional groups capable of reacting with the methylol groups without the evolution of water, and (5) an outer conductive pattern, the multilayer board being capable of withstanding at least five soldering cycles of at least 255° C. for 2 seconds without blistering or delamination. Processes for manufacturing the multilayer board are also described.

9 Claims, 4 Drawing Sheets

MULTILAYER PRINTED WIRING BOARDS

FIELD OF THE INVENTION

This invention relates to multilayer printed wiring boards, and methods for manufacturing the multilayer boards. This invention also relates to printed wiring boards made by an additive technique.

BACKGROUND OF THE INVENTION

Multilayer printed wiring boards are commmonly manufactured by the subtractive technique. In the conventional subtractive process, the inner layers are prepared on thin, copper clad, epoxy glass laminates, typically 0.1 mm to 0.2 mm thick, by etching away the unwanted copper. The inner layers are assembled in a stack with B-staged epoxy prepreg sheets between the layers and laminated together with sheets of copper foil on the outside surfaces of the stack. Holes are drilled through the multilayer laminate and the hole walls are plated to establish plated through hole connections to the internal layers. Then, the outer layers of copper foil are etched to provide the outer layer conductive patterns.

In the "mass molded" multilayer process, the operations of etching the custom conductive patterns for the inner layers and the lamination of the inner layers together with the outer layers of copper foils are carried out in central laminating plants. Then, the laminated package is sent to individual printed wiring board manufacturers who perform the operations of drilling, forming plated through holes and etching the outer surface conductor patterns to complete the multilayer board. When a completed "mass molded" board is examined by a purchaser or user, there is no obvious difference in appearance, form or function from the multilayer boards made by the standard multilayer process.

Additive multilayer boards have been made by the "mass molding" technique. The conductive patterns for the inner layers were etched in a subtractive process. The inner layers were laminated together as in the regular "mass molding" technique, but the outer surfaces were C-staged epoxy coated glass cloth, not copper. These "mass molded" packages were finished by additive printed wiring board manufacturers who applied first a plating adhesive to each surface, next drilled the through holes, and then applied a plating resist and plated the conductive pattern on the outer surfaces and through the holes to complete the multilayer board. This manufacturing procedure did not offer significant price or functional advantages over fully subtractive "mass molded" multilayer board manufacturing and has not been widely adopted. A multilayer board made by an additive process and the "mass molding" technique has a different appearance from multilayer boards made by the subtractive processes.

Other methods of making multilayer printed wiring boards start with a thicker inner layer laminate (0.2 mm to 1 mm thick) which is copper clad on both sides. The inner layer conductive patterns are etched. Instead of laminating all the layers together in a laminating press, the layers are built up sequentially on the thick inner layer laminate by adding in sequence, an insulating layer, and then another conductive pattern layer. The conductive pattern is added either by fully-additive, semi-additive or subtractive processes. In the fully-additive processes, the conductive pattern is plated directly. In the semi-additive and subtractive processes, a complete layer of copper is applied over the insulating layer and then the conductive pattern established by plating and etching. Multilayer boards made sequentially by either fully-additive processes or semi-additive processes have a distinct different appearance which is obvious to the purchaser or user.

Multilayer printed wiring boards are commonly provided with internal ground and power planes. These internal planes are frequently solid sheets of copper only interrupted by clearance holes (the perforations required for electrically isolating the through hole pattern of the printed wiring board). These ground and power planes provide power voltage and current and ground connections for the components of the multilayer printed circuit. A second function of the ground and power planes is to provide electromagnetic shielding for the multilayer printed circuit board and reduce the electromagnetic and radio frequency interference. Multiple ground and power planes and additional ground planes or shields on the surface layers with the conductive pattern are common.

When components are mounted on a multilayer printed wiring board and mass soldered in place at temperatures in the range of 275° C., a severe thermal shock is applied to the insulating layers placed between two copper planes, such as the insulating layer between an internal ground plane and ground shield on the surface surrounding the conductor pattern. Frequently, delamination will occur and blisters will form between the ground shield on the surface and the internal ground or power plane. Delamination and blistering has been a problem with multilayers made by the fully-additive, semi-additive or subtractive sequential processes.

In the multilayer printed wiring board, an application of strongly adherent oxide layers on copper has been adopted to enhance the bond between the copper conductive patterns and the insulating layers. The oxide layers are used in the press laminating processes as well as the sequential processes. Such strongly adherent oxide layers are usually applied by immersing the copper surface in hot (40°–110° C.), strongly alkaline, hypochlorite solutions. This immersion produces an adherent, black, dendritic, oxide layer with a high surface area for adhering to organic films, coatings and laminated layers. In the printed wiring industry, this oxide layer is commonly called "black oxide".

The black oxide layer is subject to attack by solutions which dissolve copper oxides. Use of such solutions are necessary in multilayer board manufacturing. In multilayer board manufacturing, the inner copper planes are coated with black oxide, and the outer layers of insulator and copper laminated over them. When holes are drilled through the multilayer laminate and the hole walls are plated to create electrical connections to the inner copper planes, the plating and cleaning solutions dissolve the black oxide surrounding the holes and leave a non-adherent ring around the hole. This is known in the industry as "pink ring" because a pink ring of copper is visible in the pattern of black oxide coated copper. At the pink ring, there is no adhesion between the copper plane and the laminated insulating layer over it. Ionic contamination and failure of insulation between holes occur where pink ring is found. Pink ring has been a severe problem for additively and sequentially manufactured multilayers.

SUMMARY OF THE INVENTION

In one aspect, this invention concerns an additive process for sequentially manufacturing multilayer printed wiring boards. In the process according to the invention, at least one inner layer copper conductive pattern is established on an organic insulating base material; coated at least a portion of the conductive pattern and the insulating base material is coated with a poly(vinyl acetal)-phenolic resin composition which firmly bonds to the copper conductive pattern and the base material and which contains an amount of amino terminated coupling agents selected from the group consisting of amino terminated organic zirconates and titanates; the coupling agent being present in an amount sufficient to contribute heat and chemical resistance to the bond between the copper surface and the poly(vinyl acetal)-phenolic coating. The poly(vinyl acetal)-phenolic coating is cured thereon. An organic dielectric insulating layer is applied on the poly(vinyl acetal)-phenolic resin coating. The insulating layer is cured firmly bonding it on the poly(vinyl acetal)-phenolic layer. A bonding composition for adherently plating metal thereon is applied over the organic dielectric insulating layer. The bonding composition comprises polymeric materials or blends of polymeric materials which, when cured are capable of being adhesion promoted, adherently plated with metal, and which, after being post cured subsequent to metal plating, do not liquify or evolve volatiles below 288° C. The bonding composition is cured and a metallic conductive pattern is additively plated to said bonding composition to create a multilayer printed wiring board, said board being capable of withstanding soldering cycles at temperatures greater than 250° C. without blistering or delamination.

This invention also is directed to a process for manufacturing a multilayer printed wiring board comprising:

establishing at least one inner layer conductive pattern on an organic insulating base material;

coating at least a portion of the inner layer conductive pattern and the insulating base material with a primer coating composition which when cured firmly bonds to the conductive pattern and the base material, said primer coating composition comprising:

the product of reacting between 20 to 60% by weight of a poly(vinyl-acetal) resin with 80–40% by weight phenolic resin in the presence of an acidic catalyst;

a coupling agent having at least two amino substituted aromatic groups covalently bonded to a titanium or zirconium central atom via an oxygen containing linkage, said coupling agent being capable of coupling to a metal surface and capable of reacting with the phenolic resin, said coupling agent being present in the composition in an amount sufficient to couple the poly(vinyl acetal)-phenolic resin reaction product to the metal surface; and sufficient organic solvent to dissolve the resins and coupling agent and establish a viscosity for the coating compos-ition suitable for applying the coating composition to a substrate;

curing said primer coating composition thereon;

applying an organic dielectric insulating layer on the primer coating;

curing said insulating layer thereon and firmly bonding it thereto;

applying a bonding composition for adherently plating metal thereon over said organic dielectric insulating layer, said bonding composition comprising:

a phenolic resin, said resin being substantially free of methyl ether groups, having an average of between four and ten phenolic rings per molecule and at least two methylol functional groups;

at least one heat resistant polymer having an aromatic or cyclic backbone and functional groups capable of crosslinking with phenolic methylol groups without evolving water, said heat resistant polymers being present in an amount sufficient to react with substantially all the methylol groups of the phenolic resin, said polymer with aromatic or cyclic backbone being capable of improving the electrical or heat resistant properties of said bonding composition;

an elastomer selected from the group consisting of neoprene, nitrile rubber and chlorosulfonated polyethylene, and vinyl and acrylic elastomers, said elastomer being 30 to 60% of the combined weight of the phenolic and heat resistant resins and elastomer;

the bonding composition capable of being applied onto a printed wiring base material and cured to a solid thermoset composition and when cured capable of being adhesion promoted for adherent metal deposition, and capable of maintaining the bond of a deposited metal for at least 10 seconds at a temperature of 430° C.;

curing said bonding composition thereon;

plating a metallic conductive pattern securely adhered to said bonding composition creating a multilayer printed wiring board, said additive multilayer board having adhesion between said 5 layers capable of withstanding exposure to at least 5 soldering cycles of at least 255° C. for 2 seconds without blistering or delamination between the layers when the conductive patterns are unperforated metal planes, the planes having areas up to 75 mm×75 mm.

In another aspect, the invention concerns an additive multilayer printed wiring board capable of withstanding soldering cycles of at least 255° C. comprising an organic insulating base material having a copper conductive pattern thereon. A layer of a poly(vinyl acetal)-phenolic resin composition covers at least a portion of the conductive pattern and the insulating base material and is cured thereon and firmly bonded thereto. The poly(vinyl acetal)-phenolic resin composition contains an amount of amino terminated coupling agents selected from the group consisting of amino terminated organic zirconates and titanates, said coupling agent being present in an amount sufficient to contribute heat and chemical resistance to the bond between the copper surface and the poly(vinyl acetal)-phenolic coating. An organic dielectric insulating layer covers at least part of the poly(vinyl acetal)-phenolic resin composition layer; and a bonding composition layer covers at least part of the organic dielectric insulating layer and is cured thereon. The bonding composition comprises polymeric materials or blends of polymeric materials which, when cured, are capable of being adhesion promoted, adherently plated with metal, and which, after being post cured subsequent to metal plating do not liquify or evolve volatiles below 288° C. An additional copper conductive pattern is plated onto the bonding layer in an additive process.

This invention also is directed to an additive multilayer printed wiring board comprising:

a first layer comprised of an organic insulating base material having a copper conductive pattern adhered thereon;

a second layer covering at least a portion of the conductive pattern and the insulating base material comprised of a thermoset primer coating of the product of reacting between 20 to 60% by weight of a poly(vinylacetal) resin with 80–40% by weight phenolic resin in the presence of an acidic catalyst; and a coupling agent having at least two amino substituted aromatic groups covalently bonded to a titanium or zirconium central atom via an oxygen containing linkage, said coupling agent coupling to the metal surface and firmly bonded to the phenolic resin, said coupling agent being present in the primer coating in an amount sufficient to couple the poly(vinyl acetal)-phenolic resin reaction product to the metal surface;

a third layer comprised of an organic dielectric insulating material covering at least part of the second layer;

a fourth layer comprised of a thermoset bonding composition covering at least part of the third layer and cured thereon, said bonding composition comprised of a phenolic resin, said resin being substantially free of methyl ether groups, having an average of between four and ten phenolic rings per molecule and at least two methylol functional groups;

at least one heat resistant polymer having an aromatic or cyclic backbone and functional groups capable of crosslinking with phenolic methylol groups without evolving water, said heat resistant polymers being present in an amount sufficient to react with substantially all the methylol groups of the phenolic resin, said polymer with aromatic or cyclic backbone being capable of improving the electrical or heat resistant properties of said bonding composition;

an elastomer selected from the group consisting of neoprene, nitrile rubber and chlorosulfonated polyethylene, and vinyl and acrylic elastomers, said elastomer being 30 to 60% of the combined weight of the phenolic and heat resistant resins and elastomer;

the bonding composition capable of maintaining the bond of a deposited metal for at least 10 seconds at a temperature of 430° C.

A fifth layer comprised of an additional copper conductive pattern plated on the fourth layer, said additive multilayer board having adhesion between said 5 layers capable of withstanding exposure to at least 5 soldering cycles of at least 255° C. for 2 seconds without blistering or delamination between the layers when the conductive patterns are unperforated metal planes, the planes having areas up to 75 mm×75 mm.

DETAILED DESCRIPTION OF THE INVENTION

The process according to this invention is described with reference to the drawings, FIGS. 1A–1H.

The multilayer printed wiring board according to this invention is constructed on an organic insulating base material having a copper conductive pattern thereon. The base material may be selected from those suitable for the printed wiring board industry such as phenolic-paper laminates, FR-2, epoxy-paper laminates, FR-3, epoxy-glass laminates, FR-4, epoxy-glass composite laminates, CEM 1, CEM 2, and CEM 3, polyimide laminates, triazine resin laminates and other base materials having adequate thermal and electrical properties. A preferred organic insulating base material is a glass reinforced thermosetting resin laminate such as epoxy-glass, FR-4. In one embodiment of this invention, the base material is catalytic for electroless metal deposition as described in Schneble et al. U.S. Pat. No. 3,546,009.

According to the invention, the conductive pattern on the base material may be provided by a subtractive process of etching a copper clad laminate.

Figure 1A:
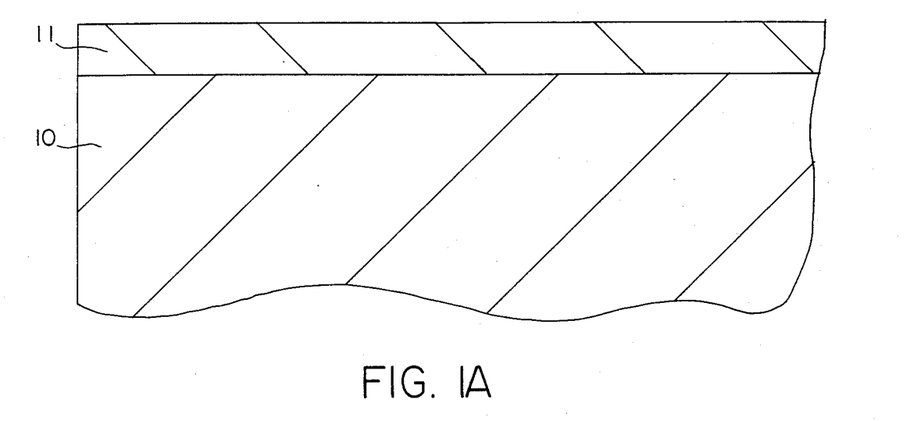
FIGS. 1A to 1H are cross section views in sequence of a multilayer board as constructed by the process of this invention.
Figure 1B:
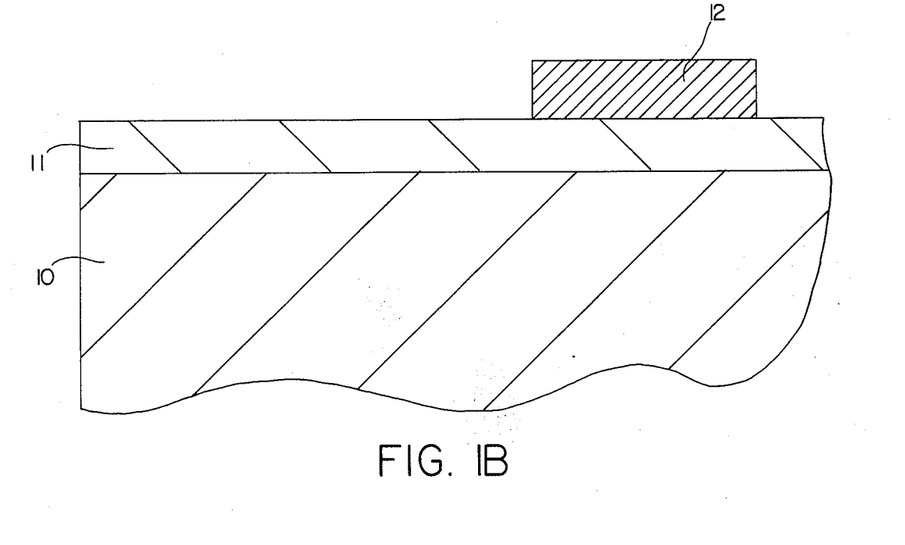

In one embodiment, the conductive pattern is provided by an additive process on an adhesive coated laminate as shown in FIG. 1A, the laminate being designated 10 and the adhesive coating 11. In FIG. 1B, a permanent plating resist, 12, is printed on the adhesive surface. One suitable resist is RISTON PAR-2 TM a photoprintable, dry film resist commercially available from E. I. DuPont de Nemours and Co., Inc. Another suitable resist is a screen printable resist PPR-102 TM commercially available from PCK Technology Division, Kollmorgen Corp., Melville, NY 11747. Other suitable permanent plating resists are well known to those skilled in the art of additive processes. After the resist image is exposed and developed, or in the case of a screen resist, UV cured, the image is oven baked for 30 minutes at 160° C. to ensure complete cure and that no volatiles remain.

Figure 1C:
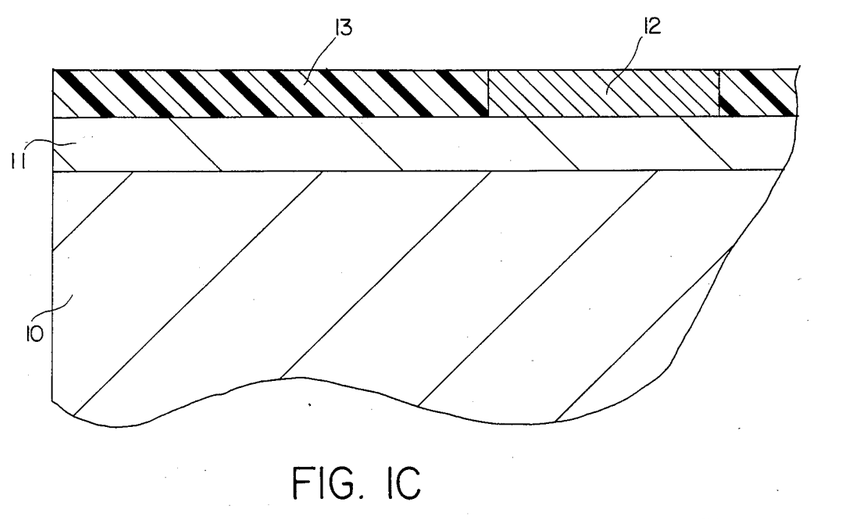

In FIG. 1C, a copper conductive pattern, 13, is plated by an additive process on the base material. Preferably, the thickness of the copper conductive pattern and the permanent plating resist are substantially equal so the next layer can be applied to a level surface.

Nonpermanent resists which are stripped after the conductive pattern is plated may also be used, but do not provide a level surface for applying the layer over the conductive pattern. The conductive patterns produced by subtractive process also do not provide a level surface for the application of the next layer. In these cases, the surface can be leveled by applying a filling material between the edges of the conductive pattern, or the subsequent layers may be applied thicker to ensure adequate coverage and insulation between layers.

The electrolessly plated copper layer is usually 35–40 micrometers thick and the permanent resist layer is 25–40 micrometers thick. After plating the base material, now provided with a copper conductive pattern, it is cleaned, rinsed, dried and post cured at 160° C. for 1 hour.

After the post cure, one side of the base material with its conductive pattern is scrubbed with pumice, rinsed, blown dry with an air knife and oven dried for only 1 minute at 150° C. The oven drying is kept short to avoid heavy oxidation of the plated copper surface.

Figure 1D:
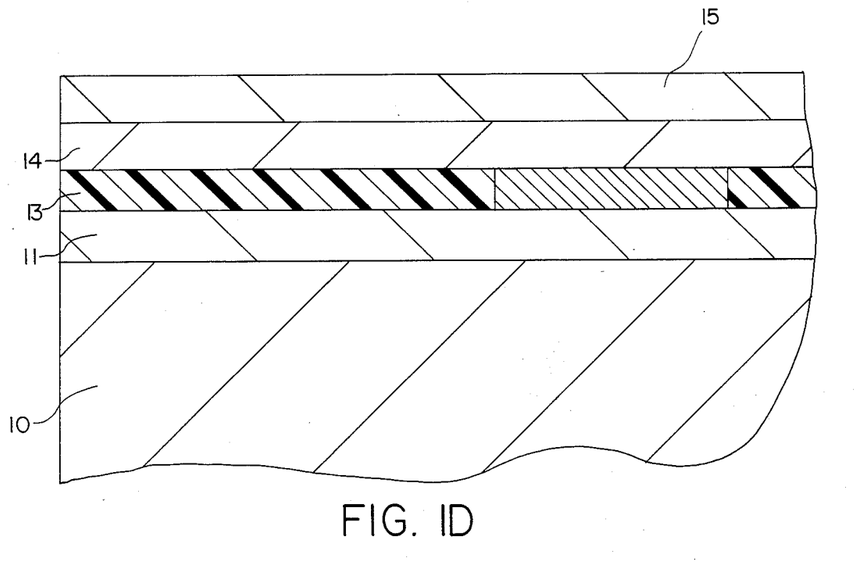

In FIG. 1D, a primer layer, 14, is applied over at least a portion of the plated copper conductive pattern and the insulating base material either by reverse roller coating, curtain coating or blank screen printing. The primer layer is applied to achieve a film thickness when dried of at least 20 micrometers, preferably 25 to 35 micrometers. The primer is a poly(vinyl acetal)-phenolic resin composition which firmly bonds to the copper conductive pattern and the base material, said resin composition containing an amount of amino terminated coupling agents selected from the group consisting of amino terminated organic zirconates and titanates, said coupling agent being present in an amount sufficient to contribute heat and chemical resistance to the bond between the copper surface and the poly(vinyl acetal)-phenolic coating. Suitable primers are described in my U.S. application Ser. No. 071,000,282, entitled "Adherent Coating For Copper" filed concurrently herewith, the disclosure of which is incorporated herein by reference. One such suitable primer has the composition given below.

| A solution containing: | | 100 g |
|---|---|---|
| poly(vinyl butyral) | 25% | |
| resole phenolic resin | 50% | |
| butyl acetate | 25% | |
| (commercially available as HRJ 4348 TM from Schenectady Chemicals, Inc., Schenectady, New York 12301 | | |
| Wollastonite (particle size less than 10 micrometers having 1 meter surface area per gram commericially available from NYCO, Willsboro, NY 12996) | | 55 g |
| Neoalkoxy tris(3-amino)phenyl zirconate (commercially available from Kenrich Petrochemical, Inc., Bayonne, NJ 07002 as LZ 97 TM) | | 1.6 g |
| Defoamer (Special combination of foam destroying substances, silicone free - believed to contain trimethyl benzene, cumene and foam destroying polymers commercially available from BYK-Chemie USA, Wallingford, CT 06492 as Byk-A 501 TM) | | 1 g |
| Butyl acetate | | 5 g |
| 2-(2-butoxyethoxy)ethanol | | 5 g |
| Clay filler containing 1200 ppm palladium | | 2 g |

This produced a viscosity of 30 to 40 Pa.s suitable for serigraphy, and the coating is applied serigraphically, and dried and partially cured at 120° C. for 20 minutes.

Other suitable primers have the composition of the primer described above except that a phenolic resin-poly(vinyl butyral) blend known as HRJ 4325 TM (commercially available from Schenectady Chemicals, Inc.) is substituted for HRJ 4348, and contain either and a neoalkoxy tris(3-amino)phenyl titanate (commercially available as Lica 97 TM from Kenrich Petrochemicals, Inc.) or the neoalkoxy tris(3-amino) zirconate.

| Phenolic resole resin | 40% |
|---|---|
| Polyvinyl butyral | 50% |
| Solvent | 10% |

The procedure above for scrubbing, drying and applying a primer layer is repeated for the conductive pattern and organic insulating base material on the second side of the base material.

An insulating dielectric layer, 15 in FIG. 1D, is applied, e.g., by either blank screen or reverse roller coating. The thickness of the coating may be varied to obtain the required impedance for the conductive pattern. A coating thickness of at least 80 micrometers is preferred.

Epoxy solder masks are suitable as the insulating dielectric layer. These masks are well known in the art. When used in this manner as the insulating layer for multilayer boards made by sequential additive processes, the solder masks are modified by the addition of a catalyst for electrolessly plating metal. Among the solder masks that may be used are:

SUN CHEMICAL TM35A TM with TM35A TM curing agent (commercially available from Sun Chemical Corp., Carlstadt, NJ 07072). modified by the addition of 4 grams of the clay filler containing 1200 ppm palladium per hundred grams.

SOLDER MASK 666 TM (commercially available from LeaRonal, Freeport, NY 11520) modified with 40 g wollastonite, 2 g neoalkoxy tris(3-amino)phenyl titanate (commercially available from Kenrich Petrochemical, Inc. as Lica 97), 4 g clay filler containing 1200 ppm palladium and 5 g 2-(2-butoxyethoxy)ethanol per hundred grams of SOLDER MASK 666. To improve the resistance to thermal stress shorten the chemical desmearing process after drilling, the solder mask can be further modified by the addition of 25 g of an epoxy novolac flexibilizer (DEN 738 TM commercially available from The Dow Chemical Co., Midland, MI 48640) and an additional 30 g wollastonite.

The liquid dielectric coating is applied to one side of the primer coated panel. For the thermally cured dielectric coatings above, the coated panel is heated to 120° C. for 20 minutes to level the coating and remove solvents. This procedure is repeated until the required thickness of the dielectric layer is obtained. The thickness is preferably at least 70 micrometers. With a properly adjusted screen printing machine, this can be achieved in 2 coats. With a roller coater, it can be achieved in one coat. At least two coats are preferred to ensure no pinholes in the dielectric coating. The thickness of the dielectric layer can be changed as required in order to obtain a controlled impedance conductive pattern.

The coating procedure is repeated to apply an insulating dielectric coating to the second side of the board. Then the board is baked for 20 minutes at 160° C. to partially cure the dielectric coating and remove all volatile solvents.

An insulating dielectric layer cured by ultraviolet radiation also may be used. A suitable ultraviolet curable composition:

| UV DIELECTRIC | |
|---|---|
| 3,4-epoxycyclohexylmethyl-3,4-epoxycyclohexane carboxylate (commercially available from Union Carbide Corp., Bound Brook, NJ 08805 as Cyracure Resin UVR-6110 TM) | 52 g |
| Epoxy based flexibilizing agent for cycloaliphatic expoxide coating systems (commercially available as Cryacure Flexibilizer UVR-6351 TM) | 48 g |
| Triaryl sulfonium salt photoinitiator [$(C_6H_5)_3S^+SbF_6^-$] (commercially available as UVE-1014 TM or UVE-1016 TM from General Electric Co., Schenectady, NY) | 0.75 |
| Clay filler containing 1200 ppm palladium | 10 g |
| Defoamer (Byk-A 501) | 2 g |
| Fluoroaliphatic polymeric ester for leveling and flow control (commercially available as FC-430 TM from 3M, St. Paul, MN 55144) | 0.1 g |
| Fumed silica (Cab-O-Sil M5 TM from Cabot Corp.) | 5 g |

The ultraviolet cured coatings are cured with about 2 joules/cm$^2$ of ultraviolet radiation. The second side is coated in the same way.

The surface of the dielectric coating is examined for protrusions which may interfere with the next layer. The protrusions were smoothed and leveled on the both surfaces with abrasive paper, and then scrubbed with pumice, rinsed and dried.

Figure 1E:
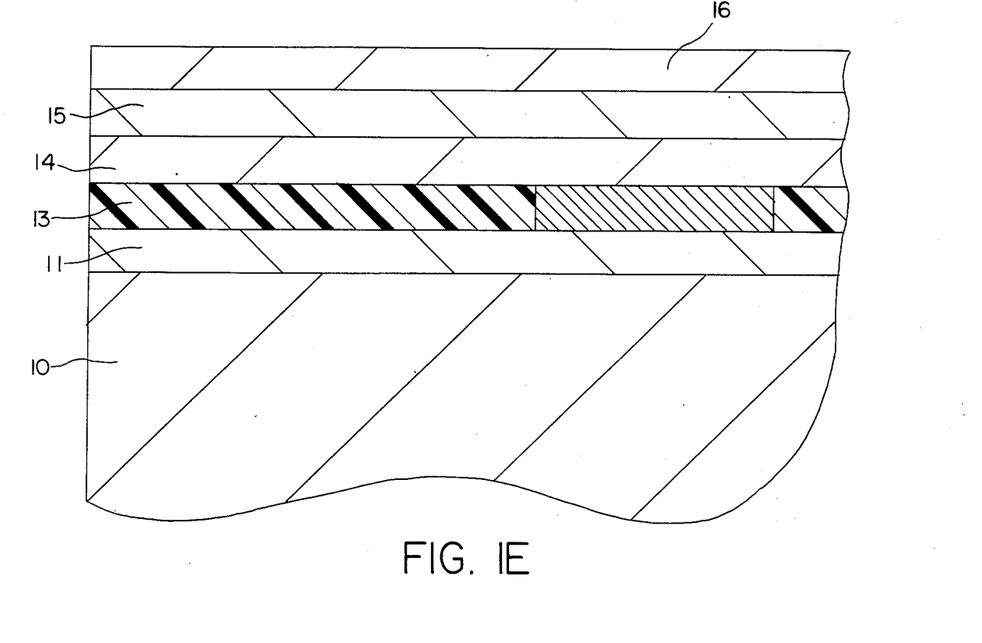

A bonding composition, 16 in FIG. 1E is applied over the insulating dielectric layer. The bonding composition may be applied in solution as a liquid by serigraphic, reverse roller or curtain coating techniques, or it may be applied as an uncured dry film by press, vacuum or hot roll lamination.

The bonding composition comprises polymeric materials or blends of polymeric materials which are capable of being cured, being adhesion promoted after curing and being adherently plated with metal. The bonding composition after post cure does not liquify or evolve volatiles below 288° C. Suitable bonding compositions are described in my U.S. application Ser. No. 071,000,281, filed concurrently herewith and entitled "Bonding Compositions for the Manufacture of Additive Printed Wiring Boards, and Articles Made with the Bonding Composition", the disclosure of which is incorporated herein by reference. One such suitable bonding composition is formulated as follows:

| | |
|---|---|
| Nitrile rubber (CBS Hycar 1041 TM, a product of The B F Goodrich Co., Cleveland, Ohio 44131) | 16.88 g |
| Chlorosulfonated polyethylene rubber (Hypalon 20 TM, a product of E. I. DuPont de Nemours & Co., Inc.) | 5.67 g |
| Palladium catalyst (1%) dispersed in a liquid epoxy resin with an epoxide equivalent weight of 180 | 3.32 g |
| Zirconium silicate filler (Excellopax TM, a product of TAM Ceramics) | 11.45 g |
| Fumed silica (Cab-O-Sil TM, a product of Cabot Corp., Tuscola, IL 61953) | 0.27 g |
| High Flash Aromatic Napthta, with 82–88% aromatics and a boiling range of 150–200° C. | 11.48 g |
| 2-Ethoxyethyl acetate | 28.76 g |
| 2-Methylphenol-formaldehyde resin with an average degree of polymerization of eight (HJR 2527 TM, a product of Schenectady Chemicals, Inc.) | 6.97 g |
| Solid diepoxide bisphenol A resin with an epoxide equivalent weight of 500 (Epon 1001 TM, a product of Shell Chemical Co.) | 12.03 g |
| Flow promoter (Modaflow TM, from Monsanto Co. - believed to be a butyl acrylate polymer) | 0.97 g |
| Catalytic Clay filler containing 1200 ppm palladium | 1.93 g |
| Neoalkoxy tris(3-amino)phenyl zirconate (LZ 97 TM, a product of Kenrich Petrochemicals, Inc., Bayonne, NJ) | 1.40 g |
| Another suitable bonding composition is formulated as follows: | |
| Phenolic resin (HRS 2527 from Schenectady Chemical Co.) | 11.0 g |
| Polyvinyl butyral resin | 15.0 g |
| Diepoxide bisphenol A resin with epoxide equivalent weight of 850-975 (Epon 1004 from Shell Chemical Co.) | 22.0 g |
| Catalytic clay filler containing 1200 ppm of palladium | 4.0 g |
| Neoalkoxy tris(3-amino)phenyl zirconate | 1.4 g |
| Flow promoter (Modaflow from Monsanto Co.) | 1.0 g |
| Defoamer (Special combination of foam destroying substances, silicone free and believed to contain trimethyl benzene, cumene and foam destroying polymers - commercially available from BYK-Chemie USA, Wallingford, CT 06492 as Byk-A 501 TM) | 1.0 g |
| Zirconium silicate filler | 15.0 g |
| 2-(2-butoxyethoxy)ethanol | 20.0 g |
| Trifunctional phenolic resin with an average eight phenol groups per molecule (HRJ 2527 from Schenectady Chemical Co.) | 11.2 g |
| Nitrile rubber (Hycar 1300 TM from The B F Goodrich Co.) | 22.4 g |
| Bismaleimide-triazine resin (commercially | 22.4 g |
| Another suitable bonding composition is formulated as follows: | |
| Trifunctional phenolic resin with an average eight phenol groups per molecule (HRJ 2527 from Schenectady Chemical Co.) | 11.2 g |
| Nitrile rubber (Hycar 1300 TM from The B F Goodrich Co.) | 22.4 g |
| Bismaleimide-triazine resin (commercially | 22.4 g |
| Another suitable bonding composition is formulated as follows: | |
| Phenolic resin (HRJ 2527 from Schenectady Chemical Co.) | 14.5 g |
| Polyvinyl butyral resin | 14.5 g |
| Bismaleimide-triazine resin | 29.0 g |
| Butyl acetate | 30.0 g |
| Neoalkoxy tris(3-amino)phenyl zirconate | 1.4 g |
| Flow promoter (Modaflow from Monsanto Co.) | 1.0 g |
| Defoamer (Byk-A 501 from Byk Chemie USA) | 1.0 g |
| Zirconium silicate filler | 12.0 g |
| Zinc octanoate | 0.015 g |
| Another suitable bonding composition is formulated as follows: | |
| Phenolic resin | 8.8 g |
| Polyvinyl butyral resin | 11.8 g |
| Bismaleimide-triazine resin | 29.4 g |
| 2-(2-butoxyethoxy)ethanol | 30.0 g |
| Neoalkoxy tris(3-amino)phenyl zirconate | 1.4 g |
| Zirconium silicate filler | 12.0 g |
| Catalytic clay filler with 1200 ppm palladium | 4.0 g |
| Defoamer (Byk-A 501 from Byk Chemie USA) | 1.0 g |
| Flow promoter (Modiflow from Monsanto Co.) | 1.0 g |
| Zinc octanoate | 0.015 g |

The viscosity of the bonding composition solution is adjusted to 0.5 Pa.s with 2-ethoxyethyl acetate. The dielectric coated board is brushed, rinsed, hot air dried and the bonding composition is applied by the curtain coating technique. The bonding composition is dried in a tunnel drier, and the second side of the board is coated by the same procedure. Then the bonding composition was cured for 1 hour at 160° C. The film thickness of the bonding composition layer is 25–30 micrometers thick after drying and curing. This heating step also finally cures the primer resin and the dielectric resin layers.

Figure 1F:
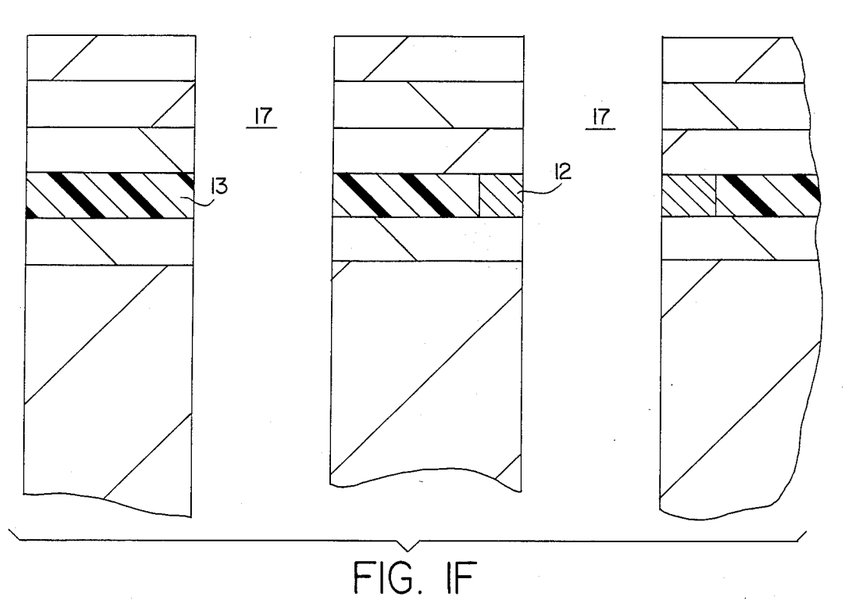

Through holes, 17 in FIG. 1F are drilled through the panels. The holes contact the internal conductive pattern, 13, where required. Through holes that are required not to contact the internal conductive pattern are drilled through the permanent resist pattern, 12.

After drilling the board is scrubbed with pumice, rinsed and washed with high pressure water spray to remove drilling debris.

Figure 1G:
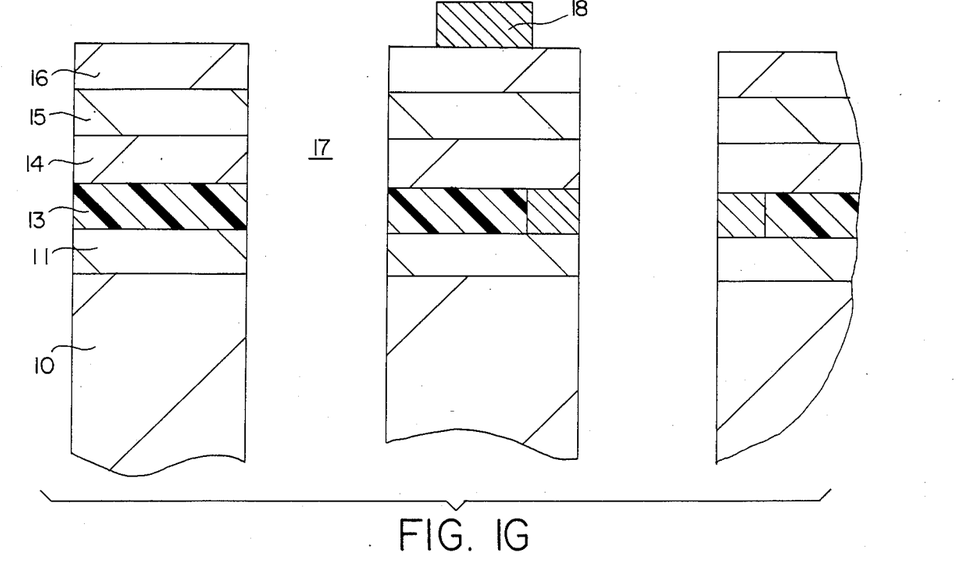

A permanent resist pattern, 18, outlining the surface conductive pattern of the outer layer is printed on both sides of the board, and then the panel is heated for 30 minutes at 120° C. to insure complete cure of the resist and removal of developing solvents.

The portion of the bonding composition not covered with the resist is adhesion promoted and the walls of the drilled holes desmeared simultaneously by immersion for 8 minutes at 52° C. in a chromic acid adhesion promotion solution containing chromic acid—40 g/l, sodium fluoride—20 g/l and sulfuric acid—12N. This is followed by a dragout rinse, a two step neutralization in sodium sulfite solution and a two stage counter current rinse.

Figure 1H:
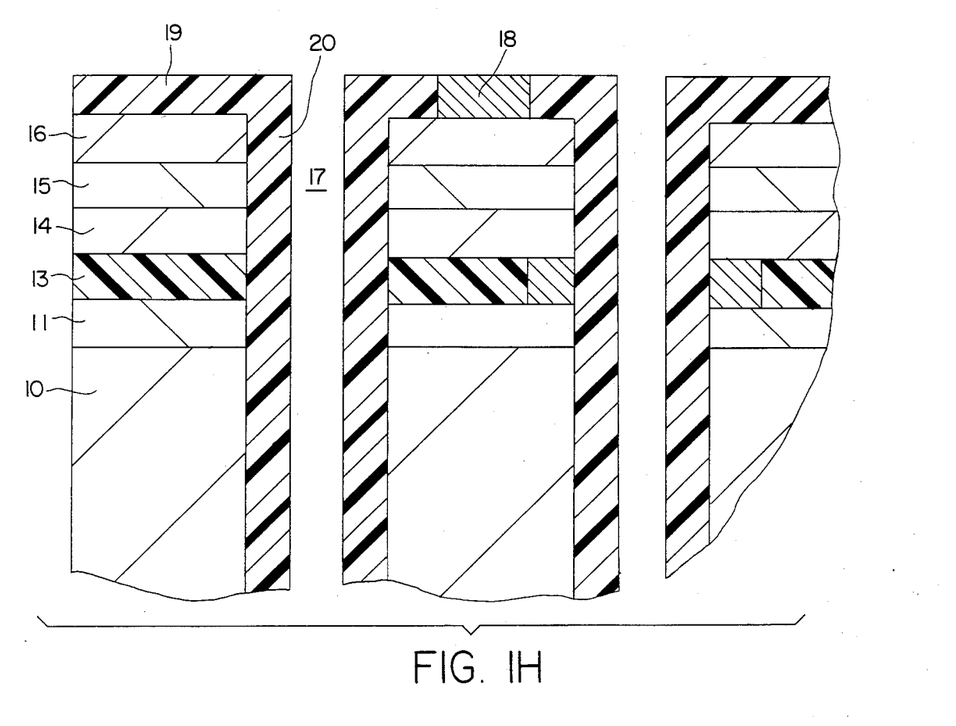

Copper is electrolessly plated on the surface conductive patterns, 19, and through the holes, 20, establishing a complete additively produced sequential multilayer board.

After plating copper the board is brushed in a brushing machine, rinsed, dried and post cured at 120° C. for 1 hour followed by 160° C. for 1 hour.

For test purposes a multilayer board had been provided with a copper surface conductive pattern containing a 75 mm×75 mm ground shield above a solid inner conductive pattern ground shield of the same dimensions. This ground shield was a solid copper pattern free from the perforations and cross hatching required in prior art ground shields of this size to prevent blistering or delamination under thermal shock. A multilayer board manufactured by the process of this invention above was thermally shocked by five cycle through a hot air solder leveling machine. Each cycle consisted of cleaning, fluxing, preheating, 2 second immersion in molten solder at 255° C., blowing off excess solder with hot air, cooling and a water wash. After five cycles the multilayer was examined for blisters or delamination in areas where a surface ground shield is over an inner layer ground shield. There was no blistering or delamination even in the unbroken ground shield areas.

The processes of this invention economically produce an additive, sequential multilayer board with thermal properties equal or superior to conventional subtractive multilayer boards or prior art additive multilayer boards. It allows the circuit designer to take advantage of the higher density designs available in additive processes compared to subtractive and at the same time the designer does not have to sacrifice the thermal resistance previously only available in the subtractive laminated multilayer.

I claim:

1. An additive multilayer printed wiring board comprising:
   a first layer comprised of an organic insulating base material having a copper conductive pattern adhered thereon;
   a second layer covering at least a portion of the conductive pattern and the insulating base material.
   the second layer comprised of a thermoset primer coating comprised of
      the product of reacting between 20 to 60% by weight of a poly(vinyl-acetal) resin with 80-40% by weight phenolic resin in the presence of an acidic catalyst; and
      a coupling agent having at least two amino substituted aromatic groups covalently bonded to a titanium or zirconium central atom via an oxygen containing linkage, said coupling agent coupling to the metal surface and firmly bonded to the phenolic resin, said coupling agent being present in the primer coating in an amount between about 0.3 and about 2% by weight of the total resin content of the primer coating;
   a third layer comprised of an organic dielectric insulating material covering at least part of the second layer;
   a fourth layer comprised of thermoset bonding composition covering at least part of the third layer and cured thereon, said bonding composition comprised of
      a phenolic resin, said resin being substantially free of methyl ether groups, having an average of between four and ten phenolic rings per molecule and at least two methylol functional groups;
      at least one heat resistant polymer having an aromatic or cyclic backbone and a functional group capable of crosslinking with phenolic methylol groups without evolving water, said heat resistant polymer being present in an amount sufficient to react with substantially all the methylol groups of the phenolic resin, said polymer with aromatic or cyclic backbone being capable of improving the electrical or heat resistant properties of said bonding composition; and
      an elastomer selected from the group consisting of neoprene, nitrile rubber, a rubber capable of crosslinking by a reaction involving a double bond, nitrile rubber and chlorosulfonated polyethylene, and polyvinyl butyral, said elastomer being 30 to 60% of the combined weight of the phenolic and heat resistant resin and elastomer; and
   a fifth layer comprised of an additional copper conductive pattern plated on the fourth layer.

2. An additive multilayer printed wiring board according to claim 1 wherein the primer coating further comprises a mineral filler selected from the group consisting of aluminas, talcs, silicates and clays, said filler being present in an amount between 10 and 60 parts filler per hundred parts of the poly(vinyl acetal)-phenolic reaction product, said coupling agent also being present in an amount sufficient to wet out and couple the filler to the poly(vinyl acetal)-reaction product.

3. An additive multilayer printed wiring board according to claim 1 wherein the amount of coupling agent is adjusted for the surface area of the filler present.

4. An additive multilayer printed wiring board according to claim 3 wherein the filler is present in an amount of at least 20 parts and less than 60 parts filler per hundred parts of the poly(vinyl acetal)-phenolic reaction product.

5. An additive multilayer printed wiring board according to claim 4 wherein the filler is present in an amount of at least 30 parts and less than 50 parts filler per hundred parts of the poly(vinyl acetal)-phenolic reaction product.

6. An additive multilayer printed wiring board according to claim 5 wherein the filler is selected from the group consisting of wollastonites and attapulgites and combinations thereof, and the coupling agent is selected from the group consisting of neoalkoxy tris(3-amino)-phenyl zirconates and titanates.

7. An additive multilayer printed wiring board according to claim 1 wherein the polymer with aromatic or cyclic backbone is selected from the group consisting of
   cyclic aliphatic epoxy resins and bisphenol A epoxy resins having an average of between 1.5 and 3 epoxide functional groups per molecule and an epoxy equivalent weight between about 170 and about 2500, and bismaleimide-triazine polymer resins.

8. An additive multilayer printed wiring board according to claim 1 wherein the bonding composition further comprises fillers and coupling agents and said coupling agents are selected from the group consisting of amino substituted organic zirconates and titanates.

9. A multilayer printed wiring board made by a sequential additive process wherein the conductive pattern of the outer layer is adherently bonded to
   a bonding layer which does not liquify or evolve volatiles below 288° C., said layer containing: phenol-formaldehyde resin, an elastomer selected from the group consisting of nitrile rubbers and poly(vinyl butyrals), polymers with aromatic or cyclic backbones selected from the group consisting of epoxy, and bismaleimide-triazine polymer resins, mineral fillers, and coupling agents selected from the group consisting of amino substituted organic zirconates and titanates;

said bonding layer being adherently bonded to an organic dielectric insulating layer;

said organic dielectric insulating layer being bonded to a layer containing a phenol-formaldehyde resole resin, a poly(vinyl butyral), a mineral filler selected from the group consisting of wollastonites and attapulgites, and a neoalkoxy tris(3-amino)phenyl zirconate, and said layer containing the phenol-formaldehyde resole resin being adherently bonded to an organic insulating base material having a copper conductive pattern thereon.

* * * * *